(12) United States Patent
Joo

(10) Patent No.: US 6,812,054 B2
(45) Date of Patent: Nov. 2, 2004

(54) TFT TYPE OPTICAL DETECTING SENSOR IMPLEMENTING DIFFERENT TFTS AND THE FABRICATING METHOD THEREOF

(75) Inventor: In-Su Joo, Kyonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 9 days.

(21) Appl. No.: 10/319,637

(22) Filed: Dec. 16, 2002

(65) Prior Publication Data

US 2003/0122165 A1 Jul. 3, 2003

Related U.S. Application Data

(62) Division of application No. 09/939,634, filed on Aug. 28, 2001, now Pat. No. 6,570,197.

(30) Foreign Application Priority Data

Aug. 31, 2000 (KR) ........................................ 2000-51295

(51) Int. Cl.$^7$ ............................................. H01L 31/072
(52) U.S. Cl. ......................................... 438/48; 438/482
(58) Field of Search ........................... 438/48, 482, 128; 257/59, 68, 72, 82

(56) References Cited

U.S. PATENT DOCUMENTS

| 5,574,293 A | 11/1996 | Arai et al. ..................... 257/59 |
| 6,570,197 B2 * | 5/2003 | Joo ............................. 257/222 |

* cited by examiner

Primary Examiner—Fetsum Abraham
(74) Attorney, Agent, or Firm—Morgan Lewis & Bockius LLP

(57) ABSTRACT

A thin film transistor optical detecting sensor includes an array substrate having a transparent substrate, a plurality of sensor thin film transistors disposed on the transparent substrate, each having a first silicon layer of a first thickness, a plurality of storage capacitors, each connected with a corresponding one of the plurality of sensor thin film transistors, storing charges of an optical current, and a plurality of switch thin film transistors, each having a second silicon layer of a second thickness less than the first thickness.

5 Claims, 5 Drawing Sheets

TFT TYPE OPTICAL DETECTING SENSOR IMPLEMENTING DIFFERENT TFTS AND THE FABRICATING METHOD THEREOF

This is a divisional of application Ser. No. 09/939,634 filed on Aug. 28, 2001 now U.S. Pat. No. 6,570,197.

This application claims the benefit of Korean patent application No. 2000-51295, filed Aug. 31, 2000 in Korea, which is hereby incorporated by reference.

BACKGROUND OF THE INVENTION

1. Field of the Invention

The present invention relates to an optical detecting sensor, and more particularly, to a thin film transistor (TFT) type optical detecting sensor.

2. Discussion of the Prior Art

In general, optical detecting sensors are used in facsimile and digital copying machines, and in fingerprint recognition systems as image readers. The optical detecting sensor stores electric charges according to an intensity of light reflected from a detecting subject, and then outputs the electric charges via a drive circuit. Recently, TFT type optical detecting sensors have been suggested in optical detecting systems such that the TFT changes its electrical characteristics in response to incident light.

An inverted staggered type TFT has been selected for typical TFT type optical detecting sensors because of its simple structure and superior quality. The inverted staggered type TFT has been classified into at least two categories: a back channel etch type TFT and an etch stopper type TFT.

A typical TFT type optical sensor will include a light source for generating light, a window for introducing the light to a subject for detection, a sensor TFT, a storage capacitor, and a switch TFT. The sensor TFT generates an optical current according to an intensity of the light reflected from the subject for detection, and the storage capacitor receives the optical current and stores electric charges of the optical current as data. Then, the switch TFT transmits the electric charges according to a control signal generated from an exterior circuit, to transfer the data to a main system.

FIG. 1 shows a conventional TFT type optical sensor including an array substrate 1 and a back light unit 2 disposed under the array substrate 1. The array substrate 1 detects a subject, stores data relating to the subject, and transmits the data to a main system (not shown) such as a fingerprint recognition system, for example. The back light unit 2 generates light for the array substrate 1. As shown in FIG. 2, the array substrate 1 includes a plurality of unit pixels "P" each including a sensor TFT "T1," a storage capacitor "C," and a switch TFT "T2." The sensor TFT "T1" and the switch TFT "T2" are both conventionally formed of the back channel etch type TFT, for example.

FIGS. 2 and 3 show the unit pixel "P" to include a sensor gate line 21, a sensor data line 61, a switch gate line 25, and a switch data line 65. The sensor gate line 21 and the sensor data line 61 cross with each other, and the switch gate line 25 and the switch data line 65 are spaced apart from the sensor gate line 21 and the sensor data line 61, respectively. The unit pixel "P" is divided into a photo-sensing region "A," a storing region "B," and a switching region "C," all of which are formed on a transparent substrate 10. A sensor gate electrode 22, a first capacitor electrode 24, a switch gate electrode 26 are formed in the photo-sensing region "A," the storing region "B," and the switching region "C," respectively. The sensor gate electrode 22 and the switch gate electrode 26 integrally protrude from the sensor gate line 21 and the switch gate line 25, respectively. Alternatively, parts of the sensor gate line 21 and the switch gate line 25 may not protrude, but may be used as the sensor gate electrode 22 and the switch gate electrode 26, respectively. The first capacitor electrode 24 integrally protrudes from the sensor gate line 21.

In FIG. 3, a first insulating layer 30 covers the sensor electrode 22, the first capacitor electrode 24, and the switch gate electrode 26. On the first insulating layer 30, a sensor silicon layer 41 and a switch silicon layer 42 are formed in the sensing region "A" and the switching region "B," respectively. A sensor ohmic contact layer 52 and a switch ohmic contact layer 54 are formed on the sensor silicon layer 41 and the switch silicon layer 42, respectively.

A sensor source electrode 62 and a sensor drain electrode 63 are formed over the sensor silicon layer 41, and a switch source electrode 66 and a switch drain electrode 67 are formed over the switch silicon layer 42. A first capacitor electrode 24 integrally protrudes from the sensor gate line 21 toward the unit pixel region "P." The sensor source electrode 62 is connected with the sensor data line 61, and the sensor drain electrode 63 is spaced apart from the sensor source electrode 62 with the sensor gate electrode 22 centered therebetween. The switch source electrode 66 is connected with the switch data line 65, and the switch drain electrode 67 is spaced apart from the switch source electrode 65 with the switch gate electrode 26 centered therebetween. A second capacitor electrode 64 is formed between the switch drain electrode 67 and the sensor drain electrode 63 and is interconnecting therewith. The second capacitor electrode 64 overlaps the first capacitor electrode 24.

A second insulating layer 70 covers the sensor source electrode 62, the sensor drain electrode 63, the second capacitor electrode 64, the switch source electrode 66, and the switch drain electrode 67. On the second insulating layer 70, a shielding pattern 80 made of an opaque material is formed over the switch silicon layer 42.

For the above-described optical detecting sensor according to the prior art, the sensor silicon layer 41 preferably has a thickness larger than 3000 Å (angstrom) to provide high efficiency. Accordingly, since the switch TFT "T2" is formed by the same fabrication process of forming the sensor TFT "T1," the thickness of the switch silicon layer 42 is also preferably larger than 3000 Å. Although the preferably large thickness of the silicon layer provides for high efficiency of the sensor TFT "T1," the large thickness increases off current of the switch TFT "T2", thereby causing noise.

SUMMARY OF THE INVENTION

Accordingly, the present invention is directed to a TFT type optical detecting sensor that substantially obviates one or more of problems due to limitations and disadvantages of the prior art.

An object of the present invention is to provide an improved TFT type optical sensor wherein silicon layers of sensor TFT and switch TFT have different thicknesses to achieve high efficiency of the sensor TFT and to decrease off current of the switch TFT.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor optical detecting sensor including an array substrate comprising a transparent substrate, a plurality of sensor thin film transistors disposed on the transparent substrate, each having a first silicon layer of a first thickness, a plurality of storage capacitors, each connected with a corresponding one of the plurality of sensor thin film transistors, storing charges of an optical current, and a plurality of switch thin film transistors, each having a second silicon layer of a second thickness less than the first thickness.

In another aspect, a method of fabricating a thin film transistor optical sensor includes steps of forming a first metal layer on a substrate, the first metal layer includes a sensor gate electrode, a switch gate electrode, and a first capacitor electrode, forming a first insulating layer on the first metal layer, forming an amorphous silicon layer and an etch stop layer on the first insulating layer, the etch stop layer disposed over the sensor gate electrode, forming a doped amorphous silicon layer to cover the amorphous silicon layer and the etch stop layer, forming a sensor silicon layer, a switch silicon layer, a sensor ohmic contact layer, and a switch ohmic contact layer from the doped amorphous silicon layer and the amorphous silicon layer, and forming a second metal layer to include a sensor source electrode, a sensor drain electrode, a switch source electrode, and a switch drain electrode.

In another aspect, an array substrate for a thin film transistor optical detecting sensor, the array substrate includes a transparent substrate, a plurality of sensor thin film transistors each having a sensor silicon layer of a first thickness, each sensor thin film transistor generating an optical current in response to light reflected from a detection subject, a plurality of storage capacitors, each connected with a corresponding one of the plurality of sensor thin film transistors, storing charges of the optical current, and a plurality of switch thin film transistors, each having a switch silicon layer of a second thickness less than the first thickness, wherein each switch thin film transistor is electrically connected with a corresponding one of the plurality of storage capacitors and selectively outputs the charges stored in the storage capacitor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiment of the present invention, examples of which are illustrated in the accompanying drawings.

In a TFT optical detecting sensor according to the present invention, a silicon layer of a switch TFT may be relatively thin whereas a silicon layer of a sensor TFT may be relatively thick, thereby improving efficiency of the sensor TFT as well as preventing generation of noise of the switch TFT. Specifically, to differentiate the thicknesses of the sensor TFT and the switch TFT, an etch stopper type TFT and a back channel etch type TFT may be selected for the sensor TFT and the switch TFT, respectively.

Figure 1:
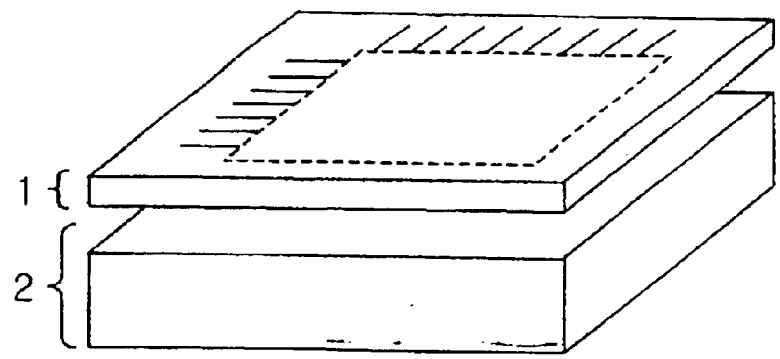
FIG. 1 is a perspective view of a conventional art TFT type optical sensor.
Figure 2:
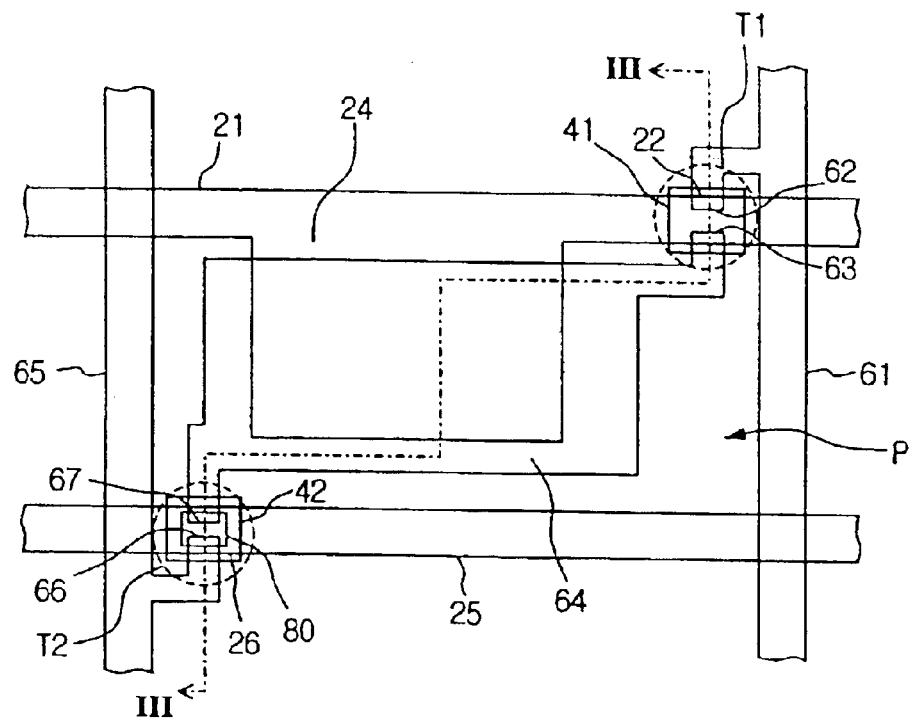
FIG. 2 is a plan view illustrating a unit pixel of the conventional TFT type optical sensor of FIG. 1.
Figure 3:
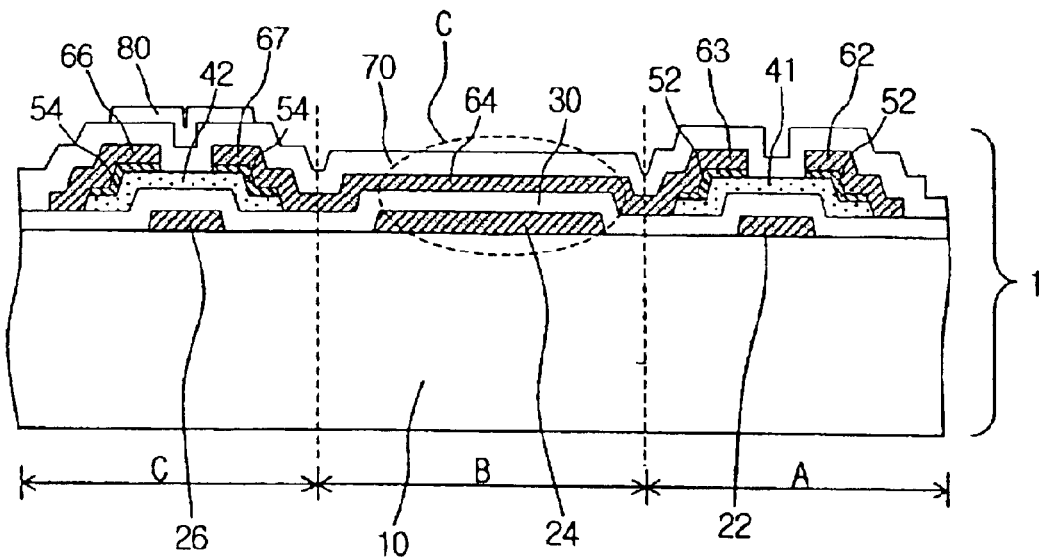
FIG. 3 is a cross-sectional view taken along line III—III of FIG. 2.
Figure 4:
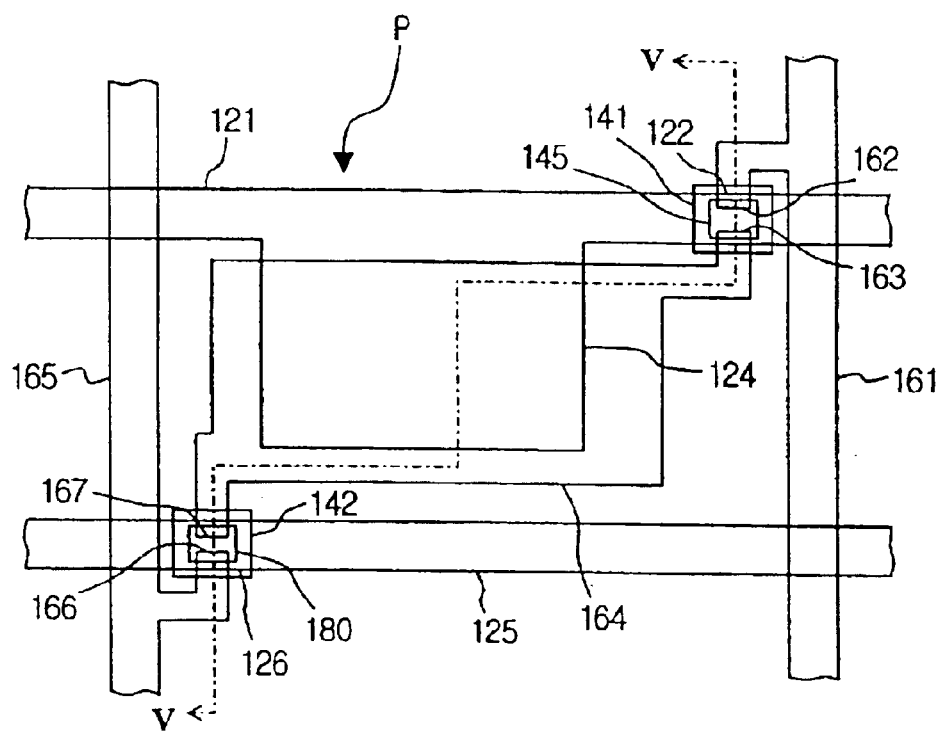
FIG. 4 is a plan view illustrating a unit pixel of an exemplary TFT type optical sensor according to the present invention.
Figure 5:
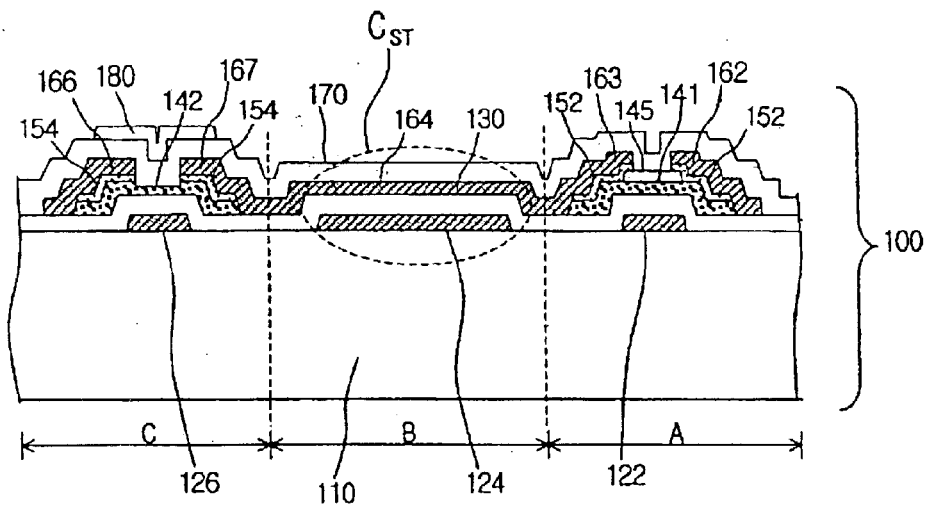
FIG. 5 is a cross-sectional view taken along a line V—V of FIG. 4.

In FIGS. 4 and 5, a sensor gate line 121, a sensor data line 161, a switch gate line 125, and a switch data line 165 may be disposed to define a unit pixel "P" of an array substrate 100 of a TFT type optical detecting sensor. The sensor gate line 121 and the sensor data line 161 may cross with each other, and the switch gate line 125 and the switch data line 165 may be spaced apart from the sensor gate line 121 and the sensor data line 161, respectively. The unit pixel "P" may be divided into a photo-sensing region "A," a storing region "B," and a switching region "C," all of which may be disposed on a transparent substrate 110. A sensor gate electrode 122, a first capacitor electrode 124, a switch gate electrode 126 may be disposed in the photo-sensing region "A," the storing region "B," and the switching region "C," respectively. The sensor gate electrode 122 and the switch gate electrode 126 may integrally protrude from the sensor gate line 121 and the switch gate line 125, respectively. Alternatively, parts of the sensor gate line 121 and the switch gate line 125 may not protrude but may be used as the sensor gate electrode 122 and the switch gate electrode 126, respectively. The first capacitor electrode 124 may be integrally connected with the sensor gate line 121.

A first insulating layer 130 made of silicon oxide ($SiO_2$) or silicon nitride ($SiN_x$), for example, may cover the sensor electrode 122, the first capacitor electrode 124, and the switch gate electrode 126. On the first insulating layer 130, a sensor silicon layer 141 and a switch silicon layer 142 may be disposed in the sensing region "A" and the switching region "B," respectively, with a thickness of the sensor silicon layer 141 being relatively larger than a thickness of the switch silicon layer 142. Additionally, an etch stop layer 145 made of a transparent insulating material including silicon nitride ($SiN_x$), for example, may be disposed on the sensor silicon layer 141. A sensor ohmic contact layer 152 and a switch ohmic contact layer 154 may be disposed on the sensor silicon layer 141 and the switch silicon layer 142, respectively. Accordingly, the etch stop layer 145 may be interposed between the sensor silicon layer 141 and the sensor ohmic contact layer 152.

A sensor source electrode 162 and a sensor drain electrode 163 may be disposed over the sensor silicon layer 141, and a switch source electrode 166 and a switch drain electrode 167 may be disposed over the switch silicon layer 142. A first capacitor electrode 124 may integrally protrude from the sensor gate line 121 toward the unit pixel region "P." The sensor source electrode 162 is electrically connected with the sensor data line 161, and the sensor drain electrode 163 is spaced apart from the sensor source electrode 162 with the sensor gate electrode 122 centered therebetween. The switch source electrode 166 is electrically connected with the switch data line 165, and the switch drain electrode 167 is spaced apart from the switch source electrode 165 with the switch gate electrode 126 centered therebetween. A second capacitor electrode 164 may be disposed between the switch drain electrode 167 and the sensor drain electrode 163 and electrically connecting therewith. The second capacitor electrode 164 overlaps the first capacitor electrode 124 to function as a storage capacitor "$C_{ST}$."

A second insulating layer 170 may cover the sensor source electrode 162, the sensor drain electrode 163, the second capacitor electrode 164, the switch source electrode 166, and the switch drain electrode 167. On the second insulating layer 170, a shielding pattern 180 made of an opaque material may be disposed over the switch silicon layer 142.

FIGS. 6A to 6E, show a fabricating method of an exemplary array substrate 100 according to the present invention.

Figure 6A:
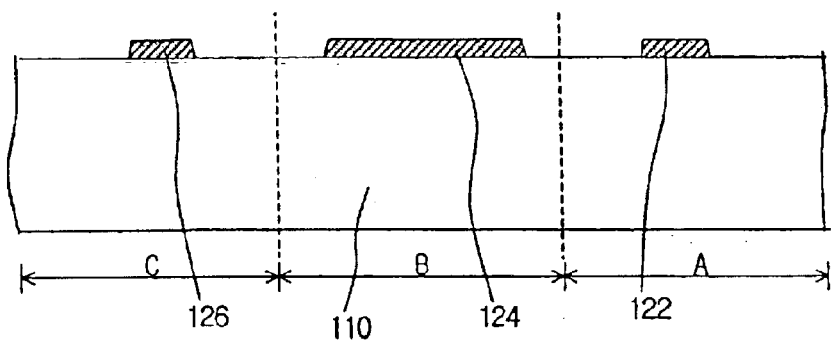
FIGS. 6A to 6E are cross-sectional views illustrating an exemplary sequence of fabricating an array substrate of a thin film transistor optical sensor according to the present invention.
Figure 6B:
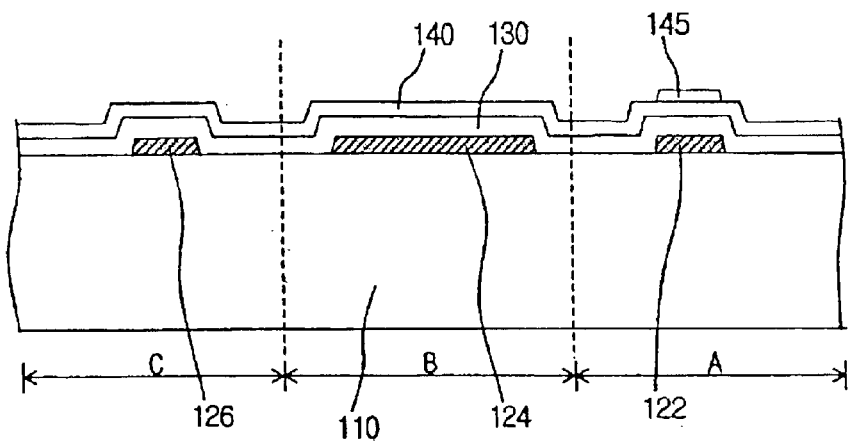

In FIG. 6A, a first metal layer may be formed by deposition, for example, on the transparent substrate 110 and subsequently patterned to form a sensor gate electrode 122, a first capacitor electrode 124, and a switch gate electrode 126. As shown in FIG. 6B, a first insulating layer 130 and an amorphous silicon layer 140 may be sequentially formed to cover the first metal layer. Then, silicon nitride ($SiN_X$) may be formed by deposition, for example, on the amorphous silicon layer 140 and subsequently patterned to form an etch stop layer 145 disposed over the sensor gate electrode 122.

Figure 6C:
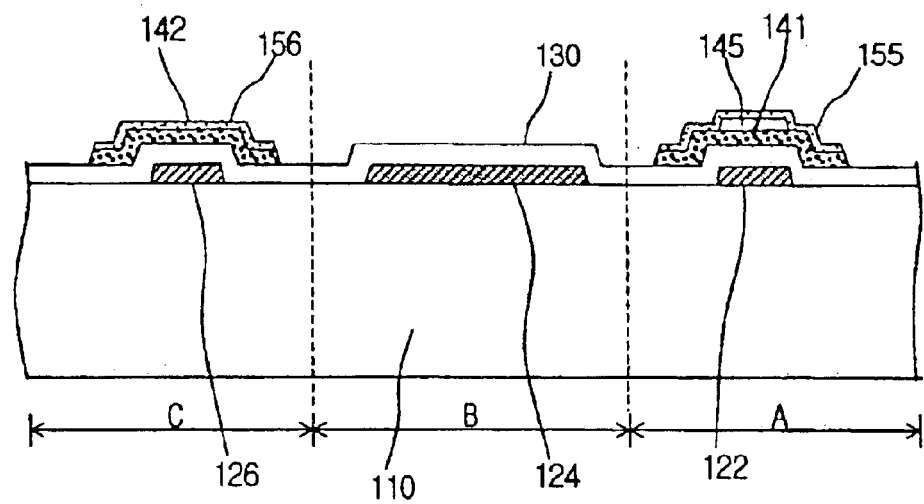

In FIG. 6C, a doped amorphous silicon layer may be formed by deposition, for example, on the amorphous silicon layer 140 (in FIG. 6B). The doped amorphous silicon layer and the amorphous silicon layer may be subsequently patterned together, thereby forming a sensor silicon layer 141 in a sensing region "A" and a switch silicon layer 142 in a switching region "C." Additionally, first and second patterned doped silicon layers 155 and 156 may be formed on the sensor silicon layer 141 and the switch silicon layer 142, respectively. The first and second patterned doped silicon layers 155 and 156 may alternatively be referred to as a sensor ohmic contact layer 152 and a switch ohmic contact layer 154, respectively. The sensor ohmic contact layer 152 and the switch ohmic contact layer 154 may be formed after additional etching processing to the first and second patterned doped silicon layers 155 and 156 in later processing.

Figure 6D:
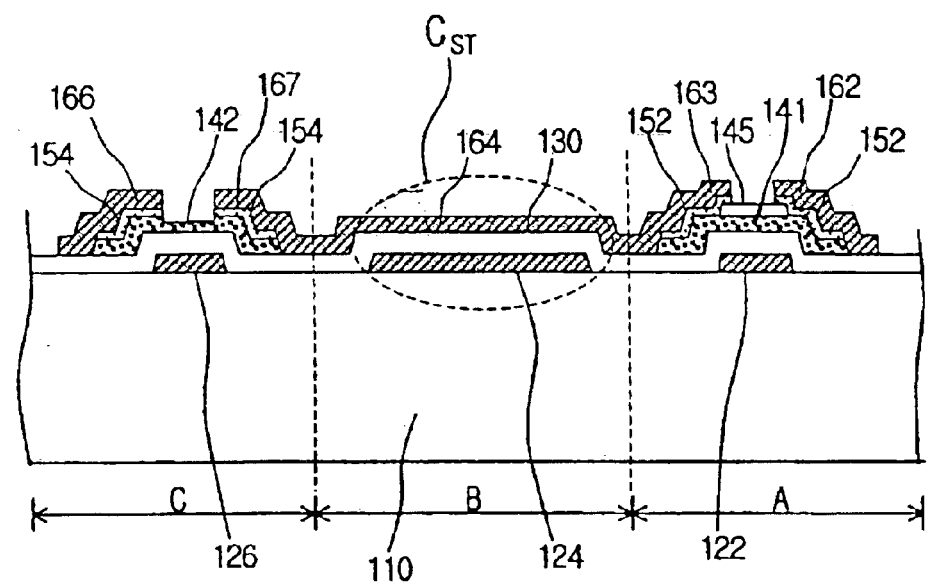

In FIG. 6D, a second metal layer may be formed by sputter deposition, for example, to cover the sensor silicon layer 141, the switch silicon layer 142, the first patterned doped silicon layer 155, and the second patterned doped silicon layer 156. The second metal layer may be subsequently patterned by etching, for example, to form a sensor source electrode 162 and a sensor drain electrode 163 disposed over the sensor silicon layer 141, and a switch source electrode 166 and a switch drain electrode 167 may be disposed over the switch silicon layer 142. Simultaneously, portions of the sensor ohmic contact layer 152 and the switch ohmic contact layer 154 may also be etched to expose the etch stop layer 145 and a portion of the switch silicon layer 142.

Still referring to FIG. 6D, because there is no relative etching selectivity between the switch ohmic contact layer 154 and the switch silicon layer 142, a portion of the switch silicon layer 142 may also be etched together with the switch ohmic contact layer 154. As compared with the switch silicon layer 142, the sensor silicon layer 141 may be protected from etching since the etch stop layer 145 is disposed on the sensor silicon layer 141. Accordingly, after the etching process is complete, the sensor silicon layer 141 is relatively thicker than the switch silicon layer 142, although they both had the same thickness prior to the etching process. Specifically, the thickness of the sensor silicon layer 141 may preferably be at least 3000 Å to provide for high efficiency, and the thickness of the switch silicon layer 142 may preferably be 500 to 1500 Å to provide for low off current.

Figure 6E:
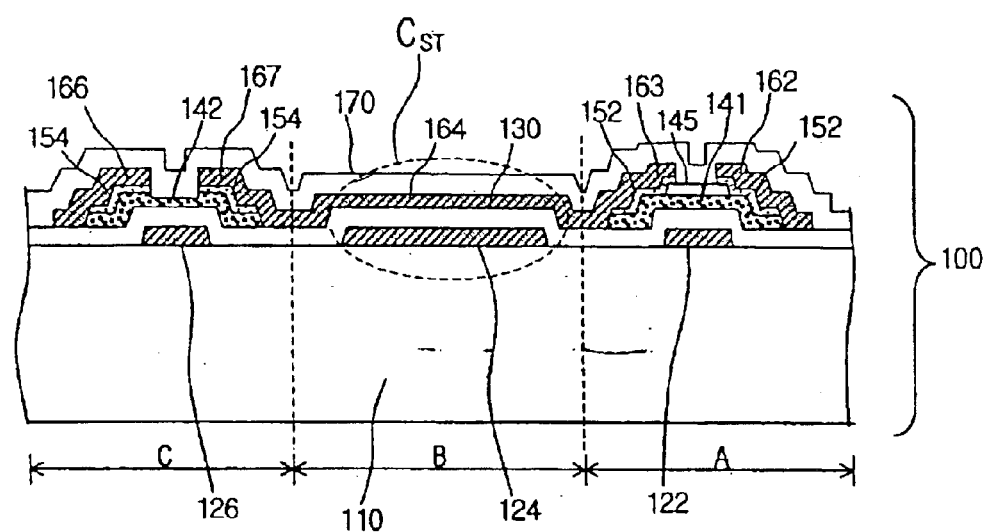

In FIG. 6E, a second insulating layer 170 is formed to cover the sensor source electrode 162, the sensor drain electrode 163, the second capacitor electrode 164, the switch source electrode 166, and the switch drain electrode 167. Then, as shown in FIG. 5, a shielding pattern 180 made of an opaque material may be disposed on the second insulating layer 170 to shield the switch silicon layer 142 from incident light.

It will be apparent to those skilled in the art that various modifications and variation can be made in the TFT type optical detecting sensor implementing different TFTs and the method of manufacturing thereof of the present invention without departing from the spirit or scope of the invention. Thus, it is intended that the present invention cover the modifications and variations of this invention provided they come within the scope of the appended claims and their equivalents.

What is claimed is:

1. A method of fabricating a thin film transistor optical sensor, comprising the steps of:

forming a first metal layer on a substrate, the first metal layer includes a sensor gate electrode, a switch gate electrode, and a first capacitor electrode;

forming a first insulating layer on the first metal layer;

forming an amorphous silicon layer and an etch stop layer on the first insulating layer, the etch stop layer disposed over the sensor gate electrode;

forming a doped amorphous silicon layer to cover the amorphous silicon layer and the etch stop layer;

forming a sensor silicon layer, a switch silicon layer, a sensor ohmic contact layer, and a switch ohmic contact layer from the doped amorphous silicon layer and the amorphous silicon layer; and forming a second metal layer to include a sensor source electrode, a sensor drain electrode, a switch source electrode, and a switch drain electrode.

2. The method according to claim 1, wherein the etch stop layer includes silicon nitride ($SiN_x$).

3. The method according to claim 1, further comprising a step of forming a second insulating layer covering the second metal layer.

4. The method according to claim 1, further comprising a step of forming a shielding pattern on the second insulating layer to shield the switch silicon layer from incident light.

5. The method according to claim 1, wherein a portion of the switch silicon layer is excluded during the step of forming the second metal layer.

* * * * *